Figure 1:
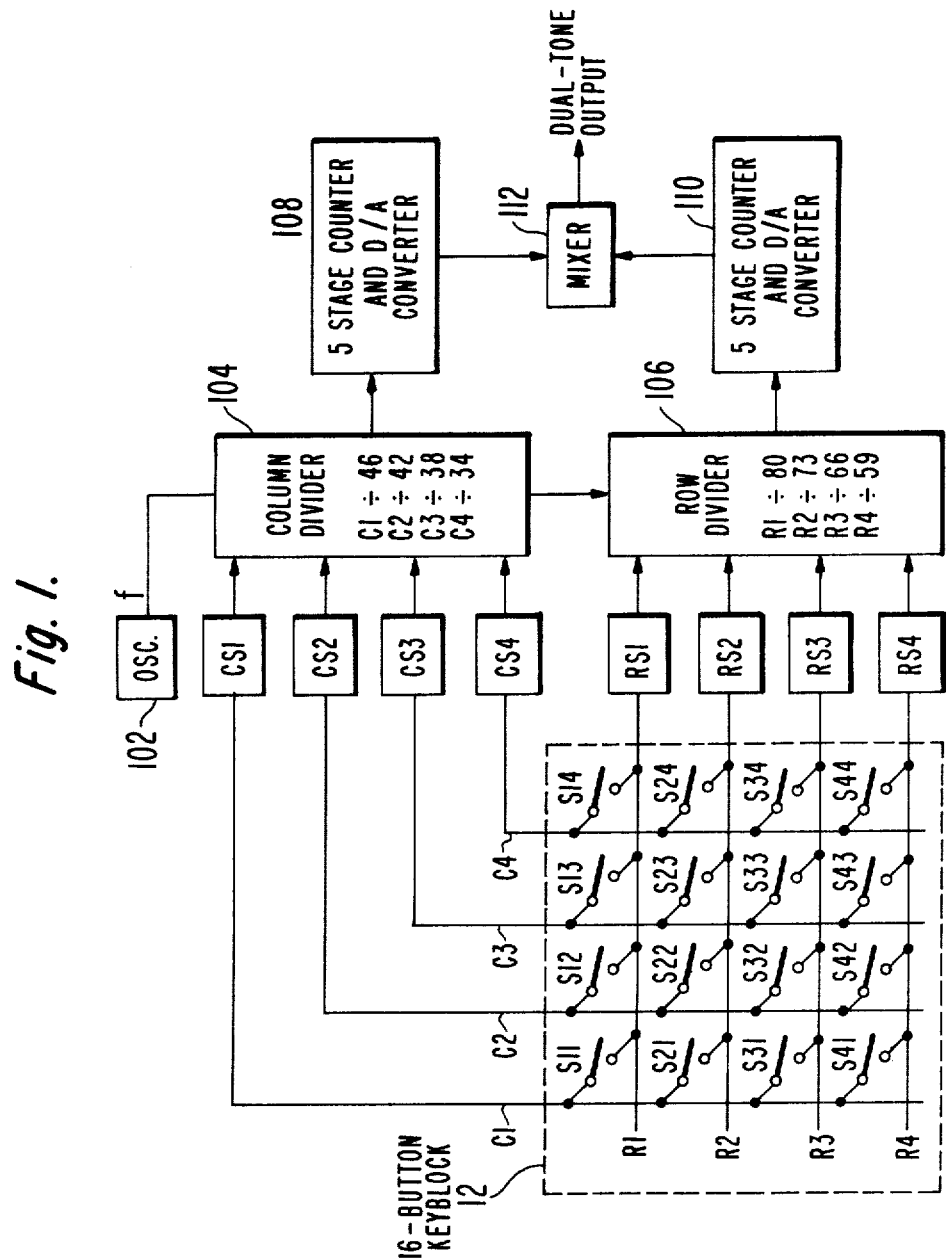

United States Patent [19]

Wilson

[11] 4,303,907
[45] Dec. 1, 1981

[54] LOW POWER SWITCH CLOSURE SENSING CIRCUIT

[75] Inventor: Robert E. Wilson, Whitehouse Station, N.J.

[73] Assignee: RCA Corporation, New York, N.Y.

[21] Appl. No.: 103,924

[22] Filed: Dec. 17, 1979

[51] Int. Cl.³ .............................................. G06F 3/02
[52] U.S. Cl. ............................ 340/365 S; 179/90 K; 330/277; 330/288; 340/365 R; 340/825.79
[58] Field of Search ............ 340/365 R, 365 S, 365 E, 340/166 R; 179/90 K; 178/17 C; 307/251, 362, 518, 584, 585, 463; 330/253, 257, 264, 269, 277, 288

[56] References Cited

U.S. PATENT DOCUMENTS

| | | | |
|---|---|---|---|
| 3,623,082 | 11/1971 | Stein et al. | 340/365 S |
| 3,660,826 | 5/1972 | Lins | 340/365 S |
| 4,069,659 | 1/1978 | Harris et al. | 340/365 R |
| 4,148,017 | 4/1979 | Tomisawa | 340/166 R |
| 4,199,750 | 4/1980 | Taguchi | 340/365 S |

Primary Examiner—James J. Groody
Attorney, Agent, or Firm—Samuel Cohen; Henry I. Schanzer

[57] ABSTRACT

A matrix array of row and column conductors, electrically isolated from each other, with a key switch connected between a row and a column conductor at each intersection of a row and a column conductor. Each column conductor is connected to a normally non-conducting current sourcing circuit and each row conductor is connected to a normally non-conducting current sinking circuit. Each key switch, when closed, connects its associated row and column conductors causing current to flow between that column's current sourcing circuit and that row's current sinking circuit. The current sourcing and the current sinking circuits associated with the particular switch closure then produce signals indicative of that key switch closure.

5 Claims, 3 Drawing Figures

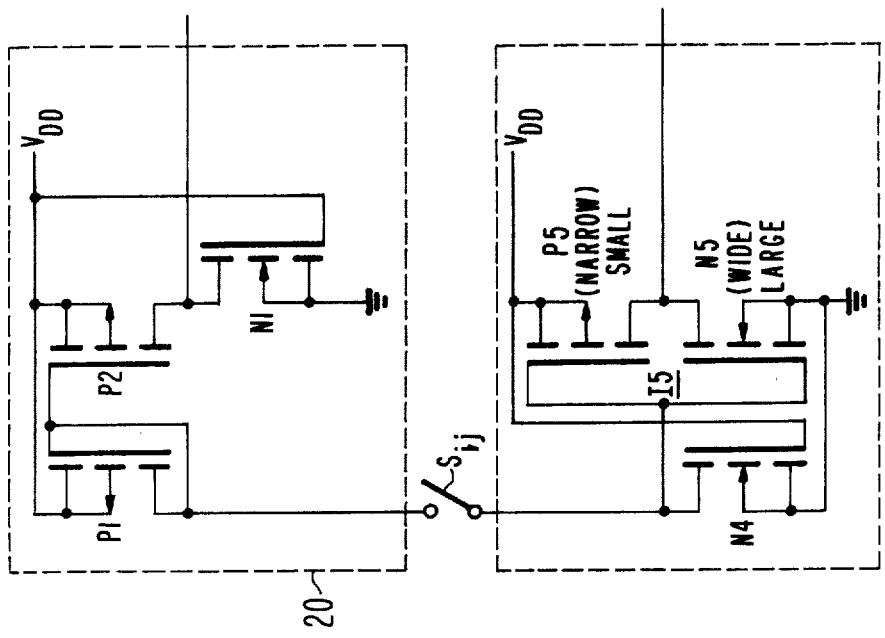
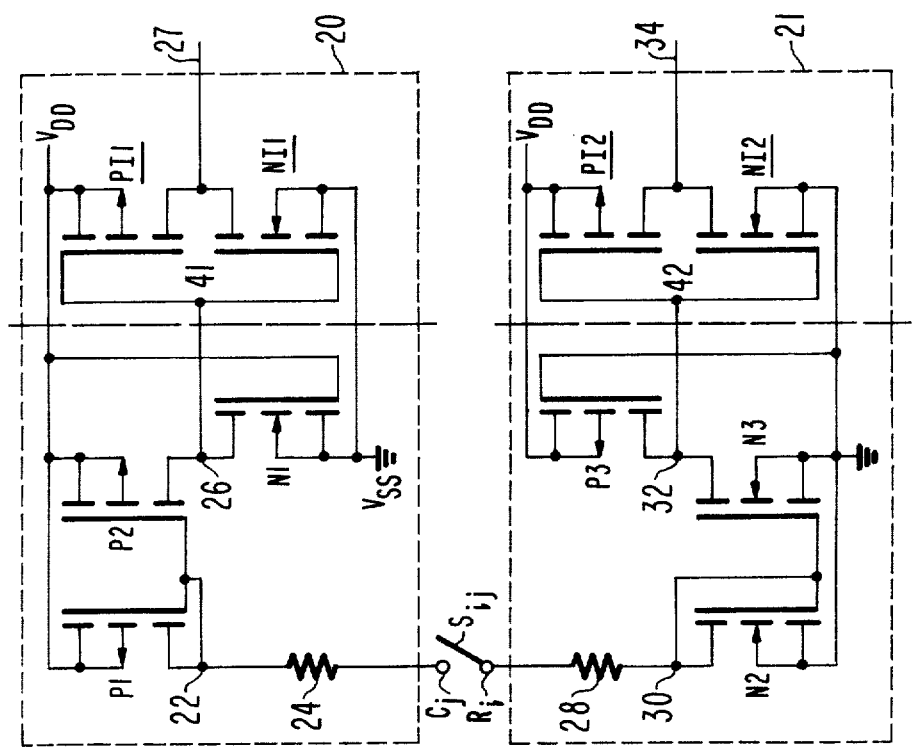
Fig. 3.
Fig. 2.

LOW POWER SWITCH CLOSURE SENSING CIRCUIT

This invention relates to a low power switch closure sensing circuit, particularly useful in conjunction with keyboards.

A keyboard comprising a plurality of push-button switches may be used, for example, in telephone dialing systems, electronic calculators, or the like electronic equipment. Desired information is inputted into the system by depressing (closing) a selected one or ones of the pushbutton (key) switches and activating electronic circuits coupled to the switches to detect their closures. In many applications it is essential that there be no power dissipation in the electronic sensing circuit in the quiescent state (i.e. when no switches are depressed).

Circuits embodying the invention include a keyboard with first and second conductors and a switch for selectively connecting said first conductor to said second conductor. The first conductor is connected to the input of a normally non-conducting current sourcing circuit and the second conductor is connected to the input of a normally non-conducting current sinking circuit. In response to a closure of the switch the first and second conductors are interconnected, current flows between the current sourcing and current sinking circuits, and each one of said circuits produces an output indicative of the switch closure.

In the accompanying drawing, like reference characters denote like components and FIG. 1 is a block diagram of a keyboard sensing system;

FIGS. 2 and 3 are schematic diagrams of switch closure sensing circuits embodying the invention and useful in the keyboard sensing system of FIG. 1.

FIG. 1 includes a keyboard 12 composed of an array of sixteen (16) single-pole, single-throw, push-button switches (Sij) disposed in four (4) rows and four (4) columns. Corresponding to each row there is a row conductor (R1, R2, R3 and R4) and corresponding to each column there is a column conductor (C1, C2, C3, C4). The column conductors are disposed in an orthogonal direction to the row conductor, with the conductors being electrically isolated from each other.

A key switch (Sij) is connected between a row and a column conductor at the intersection of each row and column conductors. Each switch (Sij) is denoted by the letter S followed by two reference numerals, the first numeral denoting the row (Ri) to which one terminal of the switch is connected and the second numeral denoting the column (Cj) to which the other terminal of the switch is connected. The keyboard 12 can be, for example, mounted on a telephone.

Normally, the key switches (Sij) are in the open position. However, when the key switch corresponding to an intersection is depressed, the switch interconnects the conductors at the intersection.

Column conductors C1, C2, C3 and C4 are, respectively, connected to the inputs of current sourcing circuits CS1, CS2, CS3 and CS4. Row conductors R1, R2, R3 and R4 are, respectively, connected to the inputs of current sinking circuits RS1, RS2, RS3 and RS4.

FIG. 2 shows one current sourcing circuit connectable by a switch to one current sinking circuit. All of the column current sourcing circuits in FIG. 1 are similar to each other in structure and operation. Likewise, all of the row current sinking circuits in FIG. 1 are similar to each other in structure and operation.

Each current sourcing circuit, 20, as shown in FIG. 2, includes three insulated-gate field-effect transistors (IGFETs) P1, P2 and N1. IGFETs P1 and P2 are interconnected to form a current mirror and N1 functions as a high impedance load for P2. The sources of P1 and P2 are connected to $V_{DD}$ while the gate of P2 and the gate and drain of P1 are connected to node 22 with a resistor 24 connected between node 22 and the column conductor Cj. The conduction (source-to-drain) path of N1, which is a high impedance (high length-to-width) ratio IGFET, is connected between the drain of P2 at node 26 and ground potential. The gate of N1 is connected to $V_{DD}$, whereby N1 is always turned-on. A complementary MOS inverter 41 comprised of IGFETs PI1 and NI1 is connected at its input to node 26 and at its output to node 27.

P1 and P2 form a current mirror with the current in P2 being some ratio (less than equal to or greater than 1) of the current through P1; the ratio being a function of the relative sizes of the two transistors. That is, the source-to-drain current (I) through P1 sets up the gate-to-source potential ($V_{GS}$) of P1 which then determines the $V_{GS}$ of P2. If P2 is structurally the same as P1, its source-drain current will tend to be the same. When Sij is open, conductor Cj is floating and P1 is non-conducting. With P1 non-conducting its $V_{GS}$ is less than the threshold level ($V_T$) necessary to induce conduction and P2 is also non-conducting. N1 with its gate at $V_{DD}$ volts is turned-on and clamps node 26 to ground. Since node 26 is connected to the gate electrodes of the transistors connected to the input of a complementary inverter I1 no direct current (d.c.) flows through N1. Consequently, there is no quiescent power dissipation in circuit 20 when Sij is open. With node 26 at zero volts the output of I1 is at $V_{DD}$ volts indicative of Sij being open.

Each current sinking circuit 21, as shown in FIG. 2, includes a resistor 28 connected between conductor Ri and a node 30. A current sinking transistor N2 is interconnected with a transistor N3 to form a current mirror. N2 and N3 are connected at their source electrodes to ground potential, and the gate and drain of N2 are connected to the gate of N3 at node 30. The conduction (source-to-drain) path of a high impedance (large length-to-width ratio) grounded gate IGFET P3 is connected between $V_{DD}$ volts and the drain of N3 at node 32. A complementary MOS inverter 42 comprised of IGFETs PI2 and NI2 is connected at its input to node 32 and at its output to node 34. N2 and N3 form a current mirror, in that the drain-to-source current of N2 establishes a $V_{GS}$ which determines the $V_{GS}$ applied to N3. If N3 is of similar structure to N2 it tends to conduct a like current.

In the absence of an input to the row conductor (if Si is open) N2 is non-conducting. With N2 non-conducting the gate-to-source potential ($V_{GS}$) of N2 and N3 is below their $V_T$ and N3 is also turned off. P3 with its gate at ground potential is turned-on but no steady state current flows through its conduction path. P3 functions to charge node 32 and the input of I2 to $V_{DD}$, but there is no quiescent current in circuit 21 and hence no quiescent power dissipation. With node 32 at $V_{DD}$ the output (node 34) of I2 is at ground potential indicative that Sij is open and that row conductor Ri is floating.

When switch Sij is closed P1 functions to source (or supply) current from $V_{DD}$ into node 22. This current then flows via resistor 22, column conductor Cj, switch Sij, row conductor Ri and resistor 28 into the drain and gate of N2 which sinks the current via its conduction path to ground. Resistors 24 and 28 are used to limit the maximum current that can flow between $V_{DD}$ and ground. However, these resistors may be shorted out (omitted) where the impedance of the conduction paths of P1 and N2 are sufficiently high to limit the current to desired levels.

The current (I1) in P1 causes a current (I2) in P2. In the desired range of operation, the current I2 is such that I2 charges node 26 to, or close to, $V_{DD}$ volts. Since N1 is a very high impedance device, P2 can, when conducting, drive node 26 and the output of inverter 41 sufficiently towards $V_{DD}$ such that the output of I1 goes "low". The low at the output of I1 indicates that Sij has been closed and that P1 is sourcing (supplying) a current into a load.

The current I1 in N1 causes a current (I3) to flow in N3. The current in N3 may be some ratio (less than one or greater than one) of the current through N2, the ratio being a function of the relative sizes of the two transistors. With N2 conducting, and since P3 is a very high impedance device, the potential at the drain of N3 and at the input to inverter 42 is driven close to ground potential. Hence, the output of inverter 42 goes to $V_{DD}$ indicating that row Ri is connected to the input of a column conductor.

Sij are push-button switches which are depressed momentarily. The circuit dissipates power only when a switch is depressed. During the normally unenergized state of the switches there is no quiescent current flow and hence no quiescent power dissipation in circuits 20 and 21.

The current sourcing circuit 20 and the current sinking circuit 21 may be modified as shown in FIG. 3 in order to obtain operation at lower operating voltages (e.g. when the operating voltage $V_{DD}$ is slightly more than two threshold voltage ($V_T$) drops above ground potential).

The current sourcing circuit 20 of FIG. 3 is identical to that shown in FIG. 2. The current sinking circuit includes a transistor N4 with its source drain path connected between the row conductor and ground and its gate returned to $V_{DD}$. N4 is a high impedance device and functions as a relatively high impedance resistor. The drain of N4 is connected to the gates of transistors P5 and N5 interconnected to form a complementary inverter I5. With Sij open N4 although turned on conducts no d.c. current. But, N4 does function to clamp the row conductor and the gates of P5 and N5 to ground. Thus, the output of I5 is at $V_{DD}$ indicating Sij is open.

When Sij is closed current flows from $V_{DD}$, via the conduction path of P1 and across N4 to ground. N4 is made to have a significantly higher impedance than P1 whereby the voltage drop across N4 is $V_{DD}$ volts less the drop across P1. Furthermore, by "skewing" inverter I5 so that N5 is larger (lower impedance) than P5, the output of I5 will be driven low (at or close to zero) when the input to I5 is close to $V_{DD}/2$.

Thus, in the circuit of FIG. 3 there is no quiescent power dissipation when Sij is open.

The current sourcing circuit 20 of FIG. 3 can be modified, if desired, to be the complement of the current sinking network of FIG. 3.

Returning to the circuit of FIG. 1, it should be evident that corresponding to a switch closure, one column circuit and one row circuit are activated. Concurrently, by means of other circuitry (not shown) responsive to any switch closure, the crystal oscillator 102 is activated and column divider circuits 104 and row divider circuits 106 are activated. The column and row dividers divide the incoming oscillator frequency by different ratios depending on which one of the switches is closed. In a particular application the dividing ratio corresponding to energizing R1, R2, R3 and R4 was, respectively, 80, 73, 66 and 59. The dividing ratio corresponding to the energizing of C1, C2, C3 and C4 was, respectively, 46, 42, 38 and 34.

The column 104 and row 106 dividers provide pulse trains to circuits 108 and 110 respectively, each of which includes a 5 stage counter and a digital-to-analog (D/A) converter circuit. The analog outputs produced by circuits 108 and 110 are step-wise approximations of sine-waves, each having 32 time periods, during which a given d.c. level is maintained. The two pseudo sine-waves are combined in a mixer circuit 112 and fed to single output terminal 114, at which is produced a dual-tone output signal.

What is claimed is:

1. The combination comprising:
    first and second conductors, electrically isolated from each other;
    a first normally non-conducting current sourcing circuit connected at one point to said first conductor;
    a second normally non-conducting current sinking circuit connected at one point to said second conductor;
    a normally open switch connected between said first and second conductors; and
    said switch, when closed, providing a conduction path for passing current between said current sourcing and said current sinking circuits rendering both conductive in response to the switch closure and immediately causing said first and second circuits to produce output signals indicative of the switch closure.

2. The combination as claimed in claim 1 wherein said first circuit includes a first insulated-gate field-effect transistor (IGFET) of first conductivity type having source and drain electrodes defining the ends of its conduction path and a control electrode,
    wherein its source is connected to a first point of operating potential and its drain is connected to said first conductor; and
    wherein said second circuit includes a second insulated-gate field-effect transistor (IGFET) of second conductivity type, having its drain connected to said second conductor and its source connected to a second point of operating potential; said second transistor passing through its source to drain path the current passing through the source to drain path of said first transistor when said switch is closed.

3. The combination as claimed in claim 2 wherein said first circuit includes a third IGFET of first conductivity type having its source connected to said first point,
    wherein the control electrodes of said first and third transistors are connected to the drain of said first IGFET whereby said first and third transistors function as a current mirror; and
    wherein said first circuit includes a fourth IGFET having its source-to-drain path connected between the drain of said third IGFET and said second point of operating potential.

4. The combination as claimed in claim 3 wherein said second circuit includes a fifth IGFET of second conductivity type having its source connected to said second point of operating potential, wherein the control electrodes of said second and fifth IGFETs are connected to the drain of said second IGFET, whereby said second and fifth IGFETs function as current mirrors; and wherein said second circuit includes a sixth IGFET having its source-to-drain path connected between the drain of said fifth IGFET and said first point of operating potential.

5. The combination as claimed in claim 3 wherein the control electrode of said second IGFET is returned to a point of fixed potential, wherein said second circuit includes an inverter comprised of first and second inverter IGFETs of first and second conductivity type, respectively; the control electrodes of said first and second inverter IGFETs being connected to the drain of said second IGFET, and the conduction paths of said first and second inverter IGFETs being connected between said first and second points of operating potential.

* * * * *